(12) United States Patent
Thornton et al.

(10) Patent No.: US 6,958,447 B1
(45) Date of Patent: Oct. 25, 2005

(54) METER BASE BRACKET APPARATUS AND SYSTEM

(76) Inventors: Michael Edward Thornton, 103 Shady La., Cumming, GA (US) 30040; Mickey Eugene Britain, 335 Cambridge Dr., Cumming, GA (US) 30040

(*) Notice: Subject to any disclaimer, the term of this patent is extended or adjusted under 35 U.S.C. 154(b) by 0 days.

(21) Appl. No.: 10/785,462

(22) Filed: Feb. 24, 2004

(51) Int. Cl.⁷ ............................................. H01H 9/02
(52) U.S. Cl. ........................ 174/58; 174/38; 174/39; 361/664
(58) Field of Search ............................ 174/58, 38, 39, 174/17 R; 361/664, 665; 52/3; 220/3.3

(56) References Cited

U.S. PATENT DOCUMENTS

| | | | |
|---|---|---|---|
| 1,966,301 A | * 7/1934 | Lewis | 361/665 |
| 3,879,641 A | * 4/1975 | Byrd | 361/664 |
| 4,751,610 A | 6/1988 | Nickola | |
| 4,796,844 A | 1/1989 | Barker | |
| 4,864,467 A | 9/1989 | Byrd et al. | |
| 5,033,971 A | 7/1991 | Franks, Jr. | |
| 5,377,074 A | * 12/1994 | Byrd | 361/664 |
| 5,400,212 A | 3/1995 | Hanson | |
| 5,405,111 A | * 4/1995 | Medlin, Jr. | 248/205.1 |

* cited by examiner

*Primary Examiner*—Dhiru R. Patel
(74) *Attorney, Agent, or Firm*—Greg O'Bradovich, P.C.

(57) ABSTRACT

An electric meter base bracket apparatus and system. Embodiments include a meter bracket installed between studs of a dwelling or structure having. The bracket includes several holes to install the bracket to the studs as well as feed-through holes for wiring to the dwelling. Bolts are included on the bracket to attach directly to the meter base. A hole can be cut through the siding so that the meter base and the bracket can connect. In dwellings having brick, the meter base is typically set further from the studs due to spacing left between the brick and the studs. As such, the invention further includes an extension that connects directly to the bracket on one side and to the meter base on the other side. An alternative embodiment of the meter base bracket includes a variable size feature.

7 Claims, 3 Drawing Sheets

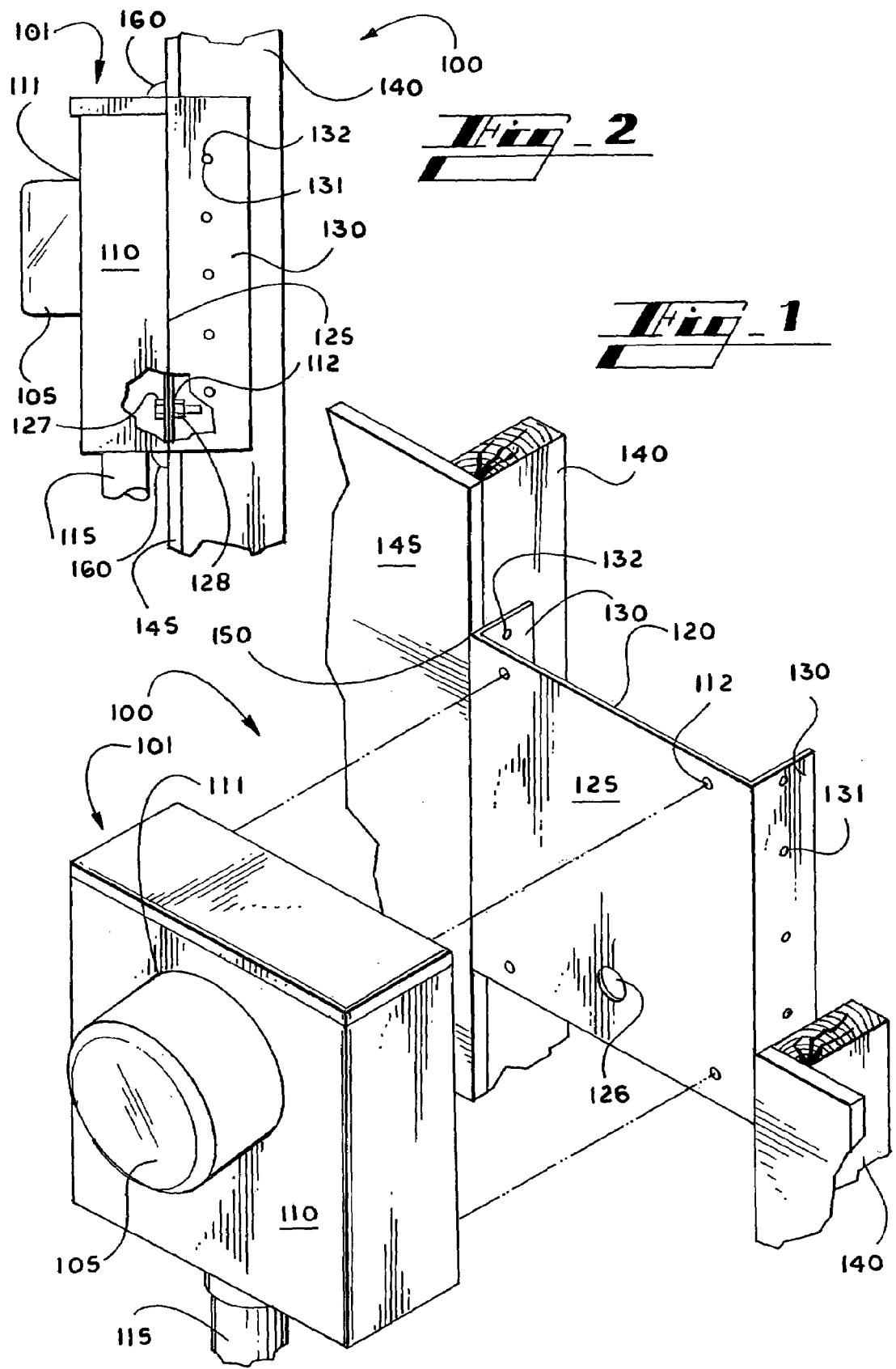

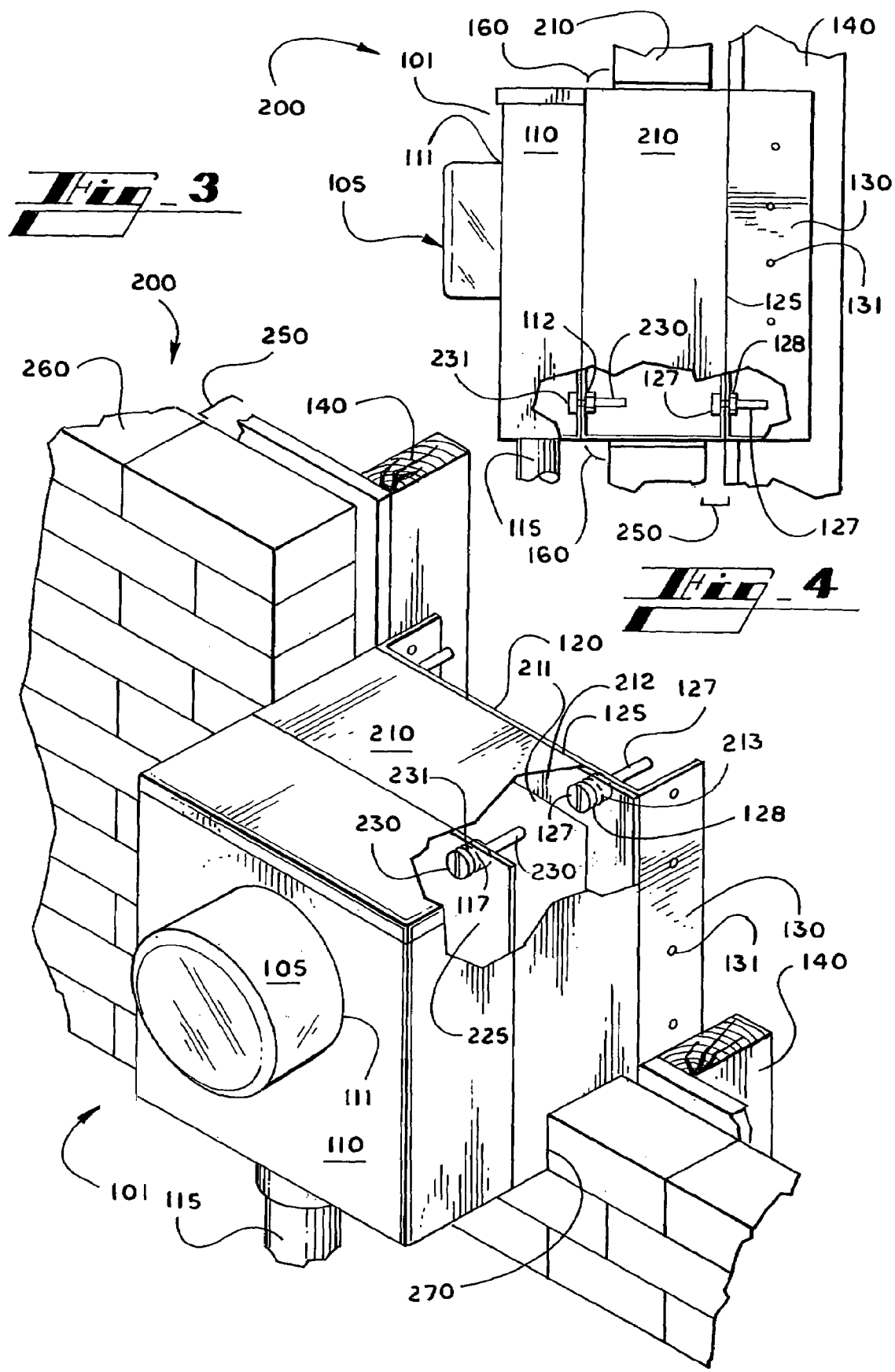

METER BASE BRACKET APPARATUS AND SYSTEM

BACKGROUND

1. Field of the Invention

The present invention relates generally to the field residential and commercial electric meter boxes and more particularly to a meter base bracket apparatus and system.

2. Description of the Related Art

Typical electrical meter boxes include a meter base that is attached directly to the exterior of a dwelling and the meter that affixes to the meter base. The meter base typically includes a feed-through so that wires can be connected between the interior of the dwelling and the meter. In a typical installation, the meter base is simply screwed to the side of the house, directly to the siding. In dwellings having brick facades, the meter base is set into a recess. Meters often must be replaced for various reasons, such as to replace an existing meter with an upgraded meter. Often times, in particular with non-brick siding, the meter base can pull away from the siding, typically during the meter changes. In addition, simply the passage of time can cause the meter bases to pull away from the dwelling because they are simply nailed to the dwelling. Potential short-circuits and other hazards can be caused when the base is pulled away in this manner.

SUMMARY

The present invention generally relates to electrical meter boxes that are used to read the electricity consumption in commercial and residential dwellings. The invention includes a meter base bracket that is installed between the studs of the dwelling having the meter. The bracket includes several holes to install the bracket to the studs as well as feed-through holes for wiring to the dwelling. Bolts are included on the bracket to attach directly to the meter base. In such embodiments, a hole is cut through the siding so that the meter base and the bracket can connect. Suitable molding is used to install around the meter base to cover any openings left around the meter base. In dwellings having brick, the meter base is typically set further from the studs due to spacing left between the brick and the studs. As such, the invention further includes an extension that connects directly to the bracket on one side and to the meter base on the other side. The recess that is normally used in the prior art as mentioned above still fits the meter base, with the addition of the bracket connected to the studs and the extension.

In general, in one aspect, the invention features an electric meter box connection apparatus, including an electric meter box having a meter base and a meter connected to the meter base, a meter base bracket having a generally planar surface and a first generally rectangular side wall connected generally perpendicular to a first side of the planar surface and a second generally rectangular side wall connected to a side opposite for the first side and in a generally parallel orientation to the first rectangular side wall, wherein the meter base bracket is connected to a rear wall of the meter base.

In one implementation, the apparatus further includes one or more threaded bolts connected generally perpendicular to the planar surface and to the rear wall of the meter base.

In another implementation, the apparatus further includes several holes drilled through the planar surface. Nuts are welded to the interior side of the planar surface insuring a secure fit when the apparatus is bolted to the meter base through holes in the back of the meter base that match the holes in the planar surface of the apparatus. This orientation allows for a secure installation of any meter base to an outside wall of any structure.

In another implementation, the apparatus further includes a feed-through conduit located on the planar surface and adapted to receive wires connected between the meter and an interior location on a dwelling.

In another implementation, the side walls further include a plurality of holes adapted to receive connection devices.

In another aspect, the invention features an electric meter box connection system, including one or more studs located within a dwelling, the studs being oriented generally vertical and parallel to each other, an electric meter box having a meter base and a meter connected to the meter base, a meter base bracket connected between two of the studs having a first generally planar surface and a generally rectangular side wall connected generally perpendicular to a first side of the planar surface and a second generally rectangular side wall connected to a side opposite for the first side and in a generally parallel orientation to the first rectangular side wall, wherein the meter base bracket is connected to a rear wall of the meter base.

In another aspect, the invention features an electric meter box connection apparatus, including an electric meter box having a meter base and a meter connected to the meter base, a meter base bracket having a generally planar surface and a first generally rectangular side wall connected generally perpendicular to a first side of the planar surface and a second generally rectangular side wall connected to a side opposite for the first side and in a generally parallel orientation to the first rectangular side wall, an extension having a generally rectangular hollow housing and a planar front surface and a rear surface, wherein the meter base bracket is connected to rear surface of the extension and wherein the front surface of the extension is connected to a rear wall of the meter base.

In one implementation, the apparatus further includes one or more studs located within a dwelling, the studs being oriented generally vertical and parallel to each other, and wherein the meter base bracket is connected between the studs.

In another aspect, the invention features an electric meter box connection apparatus, including an electric meter box having a meter base and a meter connected to the meter base, a meter base bracket having a lower bracket in a telescopic arrangement with an upper bracket, wherein the meter base bracket is connected to a rear wall of the meter base.

In one implementation, each of the lower and upper brackets include two side walls that are generally oriented parallel and in opposition to each other and a cross bar connected generally perpendicular to each of the side walls.

In another implementation, the sidewalls of the upper bracket and in a telescopic arrangement with the sidewalls of the lower bracket.

In another implementation, the lower bracket is connected between two adjacent studs of a dwelling.

In another implementation, the upper bracket is moveable with respect to the studs and to the lower bracket.

One advantage of the invention is that old dwellings can be retrofitted with embodiments of the meter base bracket system.

Another advantage is that new construction can be prefitted with embodiments of the meter base bracket system.

Another advantage is that meter bases can be installed firmly to the dwelling without pulling away from the dwelling during normal use.

Another advantage is that the wires connected to the dwelling and the meter can remain in a fixed position.

Other objects, advantages and capabilities of the invention will become apparent from the following description taken in conjunction with the accompanying drawings showing the preferred embodiment of the invention.

BRIEF DESCRIPTION OF THE DRAWINGS

FIG. 1 illustrates a perspective view of an electric meter base and an embodiment of an electric meter base bracket apparatus;

FIG. 2 illustrates a side view of an electric meter base and an embodiment of an electric meter base bracket apparatus;

FIG. 3 illustrates a perspective view of an electric meter base and an embodiment of an electric meter base bracket and extension apparatus;

FIG. 4 illustrates a side view of an electric meter base and an embodiment of an electric meter base bracket and extension apparatus.

DETAILED DESCRIPTION

Figure 5:
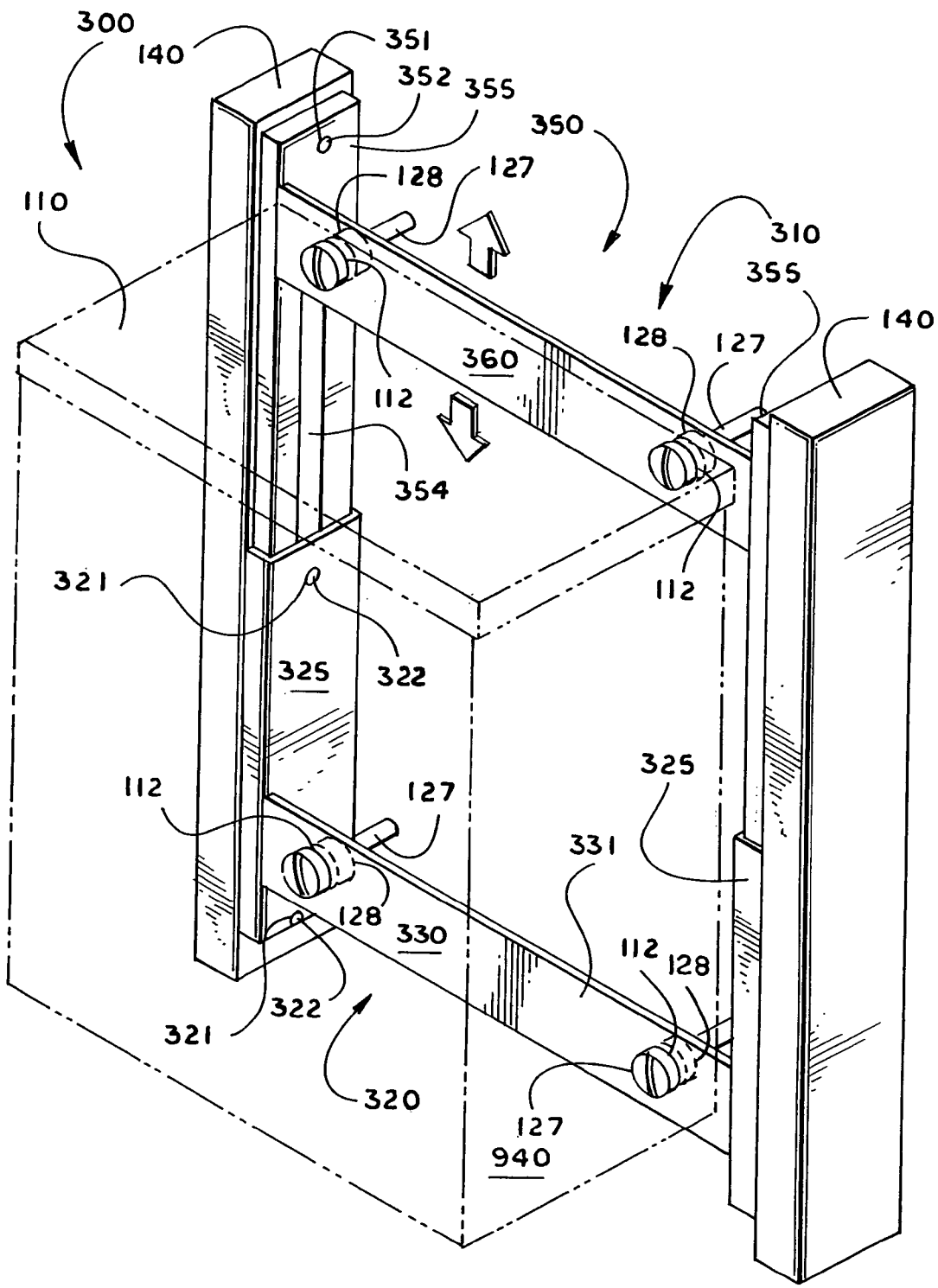
FIG. 5 illustrates a perspective view of an electric meter base and an alternate embodiment of an electric meter base bracket apparatus.

The term "dwelling" and "structure" are used throughout the description above and below. It is understood that these terms are broad and include any typw of building, house and other place that use electric meter boxes.

Referring to the drawings wherein like reference numerals designate corresponding parts throughout the several figures, reference is made first to FIG. 1 that illustrates a perspective view of an electric meter base and an embodiment of an electric meter base bracket apparatus system 100. The system 100 includes a conventional electric meter box 101 having a meter 105 connected to a respective meter base 110. The conventional meter base 110 is typically a metal box having an orifice 111 to receive the meter 105. The conventional electric meter box 101 further includes conduit 115 typically connected to a bottom portion of meter base 110. The conduit 115 is typically used to receive utility electric wiring from external sources.

The system 100 further includes a meter base bracket 120. In a typical embodiment, the meter base bracket 120 includes a generally planar surface 125. The planar surface 125 is typically a parallelogram of some type such as a square or rectangle. This parallelogram configuration is most practical for connecting to a conventional meter base, although it is understood that other geometric shapes are possible. The planar surface 125 further includes a feed-through conduit 126. The planar surface 125 also typically includes several holes 112 oriented on the planar surface 125. In one implementation, the holes 112 can be drilled onto the planar surface 125 and be integrally threaded. In another implementation, the rear side of the planar surface can include nuts 128 welded to the surface 125 and aligned with the holes 112 (see FIG. 2 below). The nuts 128 are adapted to align with corresponding holes that align with holes 112 on the meter base 110. The meter base 110 can therefore easily mount to the planar surface 125 with a number of threaded bolts 127 (see FIG. 2). The feed-through conduit 126, the threaded bolts 127 and the holes 112 are further discussed in the description below.

The meter base bracket 120 further includes side walls 130. Side walls 130 are typically connected to the planar surface 125 on opposite sides such that the side walls 130 are generally opposed and parallel to one another. In general, the meter brace bracket thus typically has a "U" shaped cross section. The side walls 130 typically include a plurality of holes 131 as discussed further in the description below.

A typical dwelling includes several internal studs 140 oriented generally vertical to the ground and parallel to one another. In general, the studs 140 are included in the system 100. In general, the spacing between studs 140 is a fixed distance in the construction industry. As such, the meter base bracket 120 is sized to this fixed distance such that the meter base bracket can fit securely between two adjacent studs 140. Therefore, the outward facing sides of the side walls 130 can be placed against the inner surface of the studs 140. Subsequently, nails, screws or other suitable attachment devices 132 can be inserted through the holes 131 and into the studs, thereby securing the meter base bracket 120 between the studs 140. The dwelling can further include an external facade 145, which can be vinyl siding, for example. The external facade 145 is oriented adjacent and in proximity to the internal studs 140. As described above in the background, a conventional meter base is connected directly to the external facade 145. In several embodiments, an opening 150 is cut into the external facade 145 to expose the meter base bracket 120. In this way, a meter base bracket 120 can easily be retrofitted into an existing dwelling by cutting the opening 150 in the location where the meter base 110 was formally installed directly on the facade 145. In addition, for new construction, the meter base bracket 120 can be pre-installed and the opening 150 in the facade 145 can be pre-cut.

When installing the meter base bracket 120, the planar surface 125 can be oriented flush to the facade 145, protruding from the facade 145 or recessed into the facade 145 depending on building requirements.

Several modifications to the meter base bracket 120 are contemplated. For example, the side walls can be lengthened and include lips that can wrap around the rear of the studs. In addition, the overall width of the meter base bracket 120 can be increased so that the side walls wrap around the outer surfaces of the studs 140. It is understood that several other modifications can be made without departing from the scope of the embodiments described above.

FIG. 2 illustrates a side view of an electric meter base 110 and an embodiment of an electric meter base bracket 120. The side view illustrates the electric meter box 101 having the meter 105, meter base 110 and conduit 115. The meter base bracket 120 is connected between two adjacent studs 140 and the side walls 130 are connected to the studs 140 via connection devices 132 through holes 131. The planar surface 125 is shown generally flush with facade 145. Molding 160 is added around the meter base 110 to cover any recesses left between the meter base 110 and the opening 150. The threaded bolts 127 are shown in the partial cutaway as protruding from the interior of the meter base 110 through corresponding and aligned holes 112 on the rear surface of the meter base 110 and through the welded nuts 128 that are attached to the interior side of the planar surface 125, creating a precise fit between the planar surface 125 and the meter base 110. IT is now appreciated that in a typical implementation, the user installing the meter base bracket 120 and the meter base 110 simply aligns the corresponding holes 112 on the meter base bracket 120 and the meter base 110, and inserts the threaded bolts 127 into the holes 112 and into threaded engagement with the nuts 128. The nuts 128 typically being welded remain stationary as the bolts 127 are screwed into the nuts 128. It is further appreciated that with the meter base bracket 120 securely fit to the studs 140 and the meter base 110 securely fit against the meter base bracket 120, the overall electric meter box 101 is fit securely to the dwelling.

FIG. 3 illustrates a perspective view of an electric meter base and an embodiment of an electric meter base bracket 120 and extension 210. As described above, several dwellings have a brick facade 260. Brick facades 260 generally are thicker than the facades 145 described above. In addition, there is typically an additional space 250 between the location of the studs 140 and the meter base 110. As such, an additional embodiment includes an extension 210 to the overall system 200.

The system 200 includes a conventional electric meter box 101 having a meter 105 connected to a respective meter base 110. The conventional meter base 110 is typically a metal box having an orifice 111 to receive the meter 105. The conventional electric meter box 101 further includes conduit 115 typically connected to a bottom portion of meter base 110. The conduit 115 is typically used to receive utility electric wiring from external sources.

The system 200 further includes the meter base bracket 120 as described above. In a typical embodiment, the meter base bracket 120 includes a generally planar surface 125. The planar surface 125 is typically a parallelogram of some type such as a square or rectangle. The planar surface 125 further includes a feed-through conduit 126. The planar surface 125 also typically include drilled holes 112 as described above, with welded nuts 128 in a typical implementation so that threaded bolts similar to described above can connect the extension 210 to the meter base bracket 120. The meter base bracket 120 further includes side walls 130. Side walls 130 are typically connected to the planar surface 125 on opposite sides such that the side walls 130 are generally opposed and parallel to one another. In general, the meter brace bracket 120 thus typically has a "U" shaped cross section. The meter base bracket 120 is connected to the studs 140 as described above. In these embodiments, the meter base bracket 120 is totally internal to the facade 160. In these embodiments having the brick facade 260, an opening 270 is typically already present for the electric meter box 101. As such, for pre-fitting or retrofitting, no additional opening must be made. It is understood that if there is no opening, the opening 270 can be made.

In order to accommodate for the additional thickness of the facade 260 and the additional space 250, the extension 210 is connected to the planar surface 125 of the meter base bracket 120. In turn, the meter base 110 is connected to the extension 210. In general, the extension 210 can be a hollow box made from the same materials as the meter base 110 and the meter base bracket 120, such as metal (although other materials are contemplated). The extension can include an overall rear opening 211 and a perimeter lip 212 that include a plurality of holes 213 to match and align with the holes 112 on the planar surface 125, which can in turn be secured by bolts 128 when the meter base bracket 120 and the extension 210 are joined together. In other embodiments, the entire rear end can be a closed surface that include the plurality of holes 213.

The extension 210 further includes an outer planar surface 225 similar to the planar surface 125 of the meter base bracket 120. The planar surface 225 includes a plurality of holes 112 that match the holes on the inside of the meter base 110 so that when inserting a threaded bolt 230 inside the meter base 110 and into the extension 210, then into the welded nut 231 on the interior side of the extension 210, the meter box 110 and the extension 210 are secured together.

It is now appreciated that the meter base bracket 120 is securely connected to the studs 140, the extension 210 is securely connected to the meter base bracket 120 and the meter base 110 is securely connected to the extension 210.

FIG. 4 illustrates a side view of an electric meter base 110 and an embodiment of an electric meter base bracket 120 and extension 210. The side view illustrates the electric meter box 101 having the meter 105, meter base 110 and conduit 115. The meter base bracket 120 is connected between two adjacent studs 140 and the side walls 130 are connected to the studs 140 via connection devices 132 through holes 131. The threaded bolts 127 are shown in a partial cutaway as they connect the meter base 110 to the extension 210 for a good alignment. The bolts 127 can screw into the welded nuts 128 as described above to secure the extension 210 to the meter base bracket 120. The extension 210 is shown as accommodating the extra thickness of the facade 260 as well as the additional space 250 between the facade 260 and the studs 140. Furthermore, the threaded bolts 230 are shown in the partial cutaway as they enter the extension 210 from the meter base 110 through the holes 112 to insure proper alignment and connection. Molding 160 can be added around the meter base 110 and extension 210 to cover any recesses left between the meter base 110 and extension 210, and the opening 270. It is now appreciated that the meter base bracket 120 is securely connected to the studs 140, the extension 210 is securely connected to the meter base bracket 120 and the meter base 110 is securely connected to the extension 210.

FIG. 5 illustrates a perspective view of an electric meter base 110 and an alternate embodiment of an electric meter base bracket 310 as an alternative meter base bracket system 300. Although meter bases 110 typically have standard and predictable dimensions, the adjustable meter base bracket 310 can be useful to accommodate different heights in meter bases 110. Similar to the embodiments described above, the meter base bracket 310 is typically connected between two adjacent studs 140 of a dwelling. A meter base 110 similar to the embodiments described above is connected to the meter base bracket 310. The adjustable meter base bracket 310 typically includes a lower bracket 320 connected to an upper bracket 350. The lower bracket 320 includes sidewalls 325 and cross bar 330 connected to and between side walls 325. The side walls 325 are generally parallel and in opposition to one another and generally perpendicular to the cross bar 330. Cross bar 330 typically includes holes 112, similar to the embodiments described above. The holes 112 typically align with threaded nuts 128 welded similarly to as described above. Threaded bolts 127 can be connected similarly as described above and protrude from the interior of the meter base 110 and engage with bolts 128 similar to the embodiments described above. The lower bracket 320 is typically connected to the studs 140 with suitable connection devices 322, such as nails inserted through holes 321 into the studs 140. Therefore, lower bracket 320 remains fixed with respect to the studs 140.

The upper bracket 350 typically includes sidewalls 355 and cross bar 360 connected to and between side walls 355. The side walls 355 are generally parallel and in opposition to one another and generally perpendicular to the cross bar 360. Cross bar 360 typically includes holes 112, similar to the embodiments described above. The holes 112 typically align with threaded nuts 128 welded similarly to as described above. Threaded bolts 127 can be connected similarly as described above and protrude from the interior of the meter base 110 and engage with bolts 128 similar to the embodiments described above. Referring again to the lower bracket 330, the side walls 325 form a hollow interior sized to receive the side walls 355 of the upper bracket 350. As such, the side walls 355 of the upper bracket 350 are in a basic telescopic arrangement with the side walls 325 of the lower bracket 320. Therefore, the side walls 355 of the upper bracket 350 can extend and retract out of and into the side walls 325 of the lower bracket 320. This extension and retraction allows the meter base bracket 310 to be sized to the meter base 110 as needed. The upper bracket 350 therefore is moveable with respect to the studs 140 and the lower bracket 320. Once the desired orientation of the lower and upper brackets 320, 350 is attained, the upper bracket 350 can be connected to the studs 140 with suitable connection devices 352, such as nails inserted through holes 351 into the studs 140. Therefore, upper bracket 350 now remains fixed with respect to the studs 140 and the lower bracket 320. In another embodiment, the sidewalls 355 can include an elongated slot 354. The slot 354 can allow clearance for the affixed connection devices 322 on the lower side walls 325 as the upper bracket 350 is moved into a desired position.

It is appreciated that a large open space is left between the lower and upper brackets 320, 350. As such, any feed-through wires into the dwelling can easily be placed in the large open space.

In another embodiment, the cross bars 330, 360 can be separated into two distinct pieces in a telescopic arrangement such that the meter base bracket 310 can also be sized side to side to accommodate any spacing differences between the studs 140.

In the embodiments described above, the meter base brackets as well as the extensions can be cut using the same tools used to cut meter bases. In one implementation, an additional meter base can be used as the extension between the meter base and the meter bas bracket in the embodiments described above for use in dwellings with brick facades.

The foregoing is considered as illustrative only of the principles of the invention. Further, various modifications may be made of the invention without departing from the scope thereof and it is desired, therefore, that only such limitations shall be placed thereon as are imposed by the prior art and which are set forth in the appended claims.

What is claimed is:

1. An electric meter box connection apparatus, comprising:
    an electric meter box having a meter base and a meter connected to the meter base;
    a meter base bracket having a generally planar surface and a first generally rectangular side wall connected generally perpendicular to a first side of the planar surface and a second generally rectangular side wall connected to a side opposite for the first side and in a generally parallel orientation to the first rectangular side wall;
    an extension having a generally rectangular hollow housing and a planar front surface and a rear surface;
    wherein the meter base bracket is connected to rear surface of the extension and wherein the front surface of the extension is connected to a rear wall of the meter base.

2. The apparatus as claimed in claim 1 further comprising one or more studs located within a dwelling, the studs being oriented generally vertical and parallel to each other, and wherein the meter base bracket is connected between the studs.

3. An electric meter box connection apparatus for connection to a dwelling having walls that include several internal elongated studs in a parallel arrangement and generally vertically arranged, the apparatus comprising:
    an electric meter box having a meter base and a meter connected to the meter base;
    a meter base bracket having a lower bracket portion in a telescopic arrangement with an upper bracket portion;
    wherein the meter base bracket is connected to a rear wall of the meter base.

4. The apparatus as claimed in claim 3 wherein each of the lower and upper brackets comprise:
    two side walls that are generally oriented parallel and in opposition to each other, the first of the side walls being connected to a first stud and the second of the side walls being connected to a second stud adjacent the first stud; and
    a cross bar connected generally perpendicular to each of the side walls.

5. The apparatus as claimed in claim 4 wherein the sidewalls of the upper brackets are in a telescopic arrangement with the sidewalls of the lower brackets.

6. The apparatus as claimed in claim 5 wherein the lower bracket is connected between the two adjacent studs of the dwelling.

7. The apparatus as claimed in claim 6 wherein the upper bracket is moveable with respect to the studs and to the lower bracket, and is to be connected to the adjacent studs when a desired position is attained.

* * * * *